United States Patent
Andersen

(10) Patent No.: US 11,249,140 B2
(45) Date of Patent: Feb. 15, 2022

(54) METHOD AND SYSTEM FOR TESTING A RECHARGEABLE BATTERY

(71) Applicant: ELTEK AS, Drammen (NO)

(72) Inventor: Hakon Andersen, Drammen (NO)

(73) Assignee: ELTEK AS, Drammen (NO)

( * ) Notice: Subject to any disclaimer, the term of this patent is extended or adjusted under 35 U.S.C. 154(b) by 114 days.

(21) Appl. No.: 16/757,754

(22) PCT Filed: Oct. 18, 2018

(86) PCT No.: PCT/EP2018/078566
§ 371 (c)(1),
(2) Date: Apr. 20, 2020

(87) PCT Pub. No.: WO2019/077047
PCT Pub. Date: Apr. 25, 2019

(65) Prior Publication Data
US 2021/0190875 A1    Jun. 24, 2021

(30) Foreign Application Priority Data
Oct. 20, 2017 (GB) ........................... 1717262

(51) Int. Cl.
*H01M 10/44*    (2006.01)
*H01M 10/46*    (2006.01)
(Continued)

(52) U.S. Cl.
CPC ........ *G01R 31/3842* (2019.01); *H02J 7/0047* (2013.01); *H02J 7/00714* (2020.01); *H02J 2207/20* (2020.01)

(58) Field of Classification Search
CPC .... H02J 7/00714; H02J 7/0047; H01M 10/44; H01M 10/46; G01R 31/3842
(Continued)

(56) References Cited

U.S. PATENT DOCUMENTS 6,268,665 B1   7/2001   Bobry
2013/0282241 A1*   10/2013   Sugiyama ............. E02F 9/2091
                                              701/50

FOREIGN PATENT DOCUMENTS

CN    101813755 A    8/2010
CN    103227489 A    7/2013
(Continued)

OTHER PUBLICATIONS

International Search Report of PCT/EP2018/078566.
UK Search Report for the priority UK application.
First Office Action of the priority CN application.

*Primary Examiner* — Edward Tso
(74) *Attorney, Agent, or Firm* — J.C. Patents

(57) ABSTRACT

A method of testing a rechargeable battery (4) connected to a DC bus (5) of a converter (11) of a power supply system (10) including a control system (12) for controlling power transfer between a power source (2), the rechargeable battery (4), and a load (3) connected to the DC bus (5) is provided. The method includes: setting a test discharge current (I4d) and a test end voltage (Vend) for the rechargeable battery (4) to be used during the test; at a first point in time (T0), starting a test run measuring a current (I4) from the rechargeable battery (4) and a voltage (V4) over the rechargeable battery (4); at a second point in time (Tend), when the V4 becomes equal to the Vend, terminating the test run; and registering the time period elapsed between T0 and Tend as a measure of the status of the rechargeable battery (4).

19 Claims, 4 Drawing Sheets

(51) Int. Cl.
*G01R 31/3842* (2019.01)
*H02J 7/00* (2006.01)

(58) Field of Classification Search
USPC ....... 320/132, 133, 134, 136, 152, 155, 162;
324/426, 433, 434; 702/63, 64
See application file for complete search history.

(56) References Cited

FOREIGN PATENT DOCUMENTS

| | | |
|---|---|---|
| CN | 106093778 A | 11/2016 |
| GB | 2352568 A | 1/2001 |
| JP | 2001061237 A | 3/2001 |

\* cited by examiner

METHOD AND SYSTEM FOR TESTING A RECHARGEABLE BATTERY

CROSS-REFERENCE TO RELATED APPLICATIONS

This application is a National Stage of International Application No. PCT/EP2018/078566, filed on Oct. 18, 2018, which claims priority to GB Patent Application No. 1717262.8, filed on Oct. 20, 2017, both of which are hereby incorporated by reference in their entireties.

TECHNICAL FIELD

The present disclosure relates to a method and system for testing a rechargeable battery. More specifically, the disclosure relates to testing of a live rechargeable battery.

BACKGROUND

Power supply systems typically include converters for converting the input power from an AC source (typically the mains) to a DC power (typically supplied to a DC load, such as a data center, telecommunication equipment etc.). Such a power supply system includes an AC-DC converter, referred to as a rectifier. Also DC power sources, such as solar power, wind power etc. are commonly used to supply power to an AC network or an AC load. Here a DC-AC converter, referred to as an inverter, is used. Also DC-DC converters are commonly available.

Rechargeable batteries are used in such power supply systems as a backup power to provide uninterruptable power supply (UPS) functionality. Many converters are bidirectional to allow charging and discharging these rechargeable batteries.

Eltek is a manufacturer of the FlatPack2 AC-DC converter series, the FlatPack2 DC-DC converter series and inverters. Eltek is also a manufacturer of theRectiverter®, a converter having an AC input port, an AC output port, and a bidirectional DC port connected to a rechargeable battery.

Rechargeable batteries in power supply systems can be tested periodically. If there are indicators of a failing battery or a battery having limited charging possibilities, the battery must be replaced.

One method of testing such rechargeable batteries is to discharge a fully charged battery with a known, constant current until a predetermined voltage level is reached by connecting a known, constant load to the battery. By comparing the time period from the start of the test to the end of the test with the battery manufacturer data sheet (battery table) it is possible to determine the battery state. This method is defined in IEEE std. 1188-2005. It should be noted that this method requires a constant current or constant power load in order to determine the battery state. During such a test, the battery being tested is often disconnected from the power supply system. One reason for this is the ability to test the disconnected battery with a known and constant load, to enable predictable test conditions.

The above method requires a lot of time and manual work. Testing of rechargeable batteries used in such power supply systems typically lasts from several minutes to several hours, depending on the battery backup capacity. Often, it is not acceptable to test all batteries of a power supply system at one location simultaneously, as battery power must be available to the power supply system in case of loss of grid power etc. In some situations, maybe only one third of the batteries can be tested simultaneously. Manual work may increase the risk of human errors during disconnection/reconnection of batteries, during testing etc.

Some power supply systems may use the above method without disconnecting the batteries from the power supply system, for example power supply systems with no load or a low, constant load at known periods of time (for example during night time). However, most power supply systems have variations in load which are impossible to predict.

The object of the present disclosure is to provide an improved method and system for testing a rechargeable battery with reduced need for manual work.

Another object of the present disclosure is to provide a test method and test system which uses the test principles recommended by the battery manufacturer.

SUMMARY

The present disclosure relates to a method of testing a rechargeable battery connected to a DC bus of a converter of a power supply system including a control system for controlling power transfer between a power source, the rechargeable battery and a load connected to the DC bus, the method including the steps of:
  setting a test discharge current for the rechargeable battery to be used during the test;
  setting a test end voltage for the rechargeable battery to be used during the test;
  at a first point in time, starting a test run measuring a battery current from therechargeable battery and a battery voltage over the rechargeable battery;
  at a second point in time, when the measured battery voltage becomes equal to the test end voltage, terminating the test run; and
  registering a time period elapsed between the first point in time and the second point in time as a measure of a status of the rechargeable battery;
  during the test run, the method includes the steps of:
  bringing the converter to deliver an output voltage which is lower than the battery voltage, thereby causing the rechargeable battery to supply power to the load; and
  bringing the control system to control at least one of the converter output voltage and the converter output current so that the battery current is kept within a predetermined range of the test discharge current.

In one aspect, the battery current is within a range of 0.7 to 1.3 of the test discharge current.

In one aspect, the battery current is within a range of 0.8 to 1.2 of the test discharge current.

In one aspect, the battery current is within a range of 0.9 to 1.1 of the test discharge current.

In one aspect, the method further includes the step of aborting the testing of the rechargeable battery if a failure situation is detected by the control system.

The present disclosure also relates to a power supply system including a converter and a control system for controlling the converter, where the control system is configured to perform the method above.

DETAILED DESCRIPTION OF DRAWINGS

Embodiments of the disclosure will now be described with reference to the enclosed drawings, where:

Figure 1:
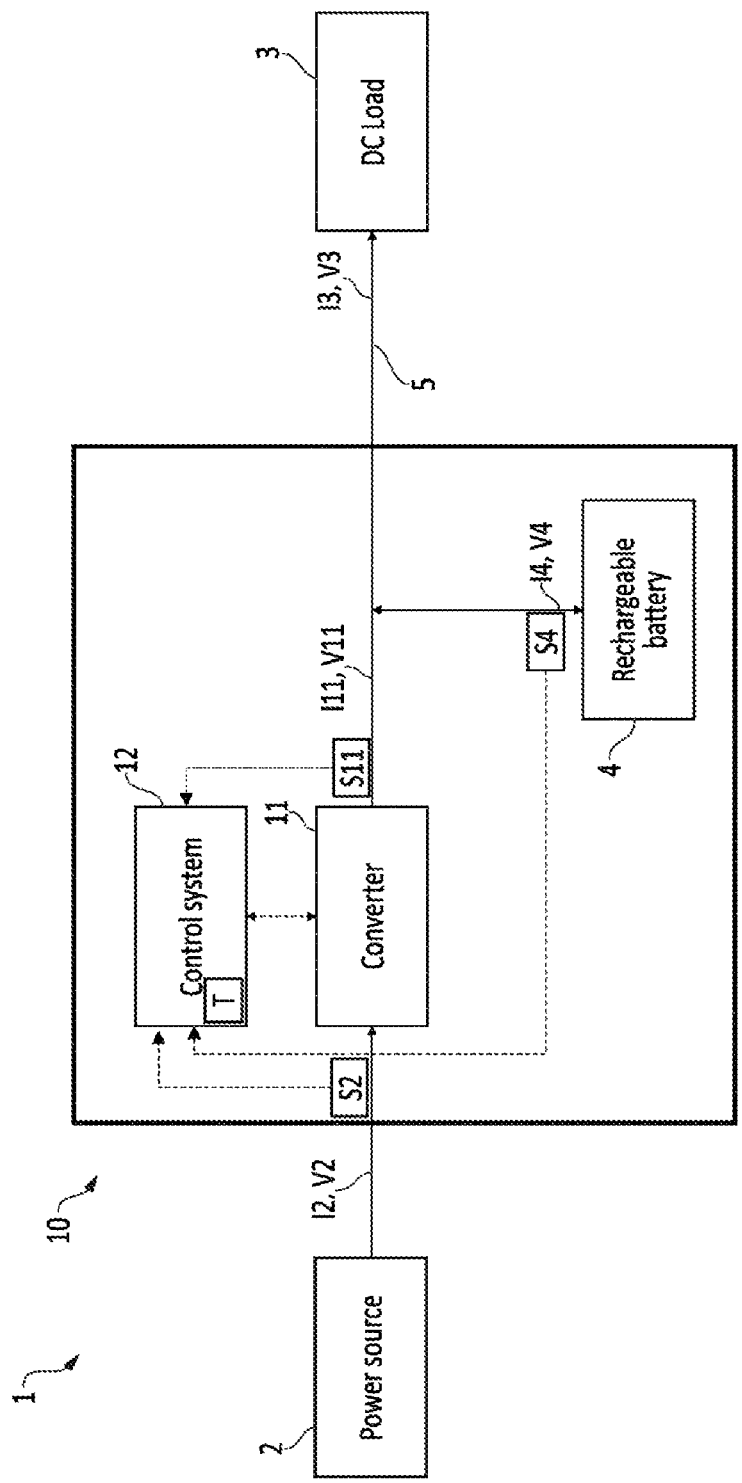
FIG. 1 illustrates a power supply system connected between the mains and a DC load via a DC bus, where a rechargeable battery is connected to the DC bus.

In the drawings, solid-drawn lines indicate power flow, while dashed lines indicates communication signals.

DESCRIPTION OF EMBODIMENTS

In FIG. 1, a power system is generally indicated with arrow 1, including a power supply system 10 connected to a power source 2 and to a DC load 3 via a DC bus 5.

The power source 2 is typically the mains, but may also be a local power source such as a diesel generator or a windmill generator, which are AC power sources.

The power supply system 10 includes a rechargeable battery 4 connected to the DC bus 5. The rechargeable battery 4 may be one battery or a group of batteries.

The power supply system 10 further includes a converter 11 and a control system 12 for controlling the converter current I11 and/or the converter voltage V11 supplied to the DC bus. In the embodiment, the converter 11 includes an AC-DC converter. It should be noted that the power source 2 may also be a DC power source, such as solar panels etc. In other embodiments, the converter 11 may include a DC-DC converter. The control system 12 may include a digital signal processor which is capable of receiving signals from different sensors of the power system 1 and/or the power supply system 10 and which includes a software for controlling the converter 11 based on these signals. Some of these signals are from sensors S2, S4, S11. The sensor S2 is capable of sensing the converter input voltage V2 and the converter input current I2, i.e. the voltage and current supplied from the power source 2 to the converter 11. The sensor S4 is capable of sensing a battery voltage V4 and a battery current I4. The sensor S11 is capable of sensing the converter output voltage V11 and the converter output current I11.

As is known for a person skilled in the art, the load current I3 can be calculated based on the converter output current I11 and the battery current I4. It should be noted that the control system 12 may be connected to other sensors as well.

The DC load may be typically a critical load, such as servers in a data center, telecom equipment etc. When power is available from the power source 2, power from the power source 2 is supplied to the DC bus through the converter 11 of the power supply system 10, thereby supplying power to the load 3. If the battery 4 is not fully charged, power is supplied to the battery 4 as well. In case of insufficient power from the power source 2, power is supplied from the battery 4 to the load 3.

In FIG. 1, it is also shown that the control system 12 includes a timer T capable of measuring time. The timer T may be typically available as a software module in the digital signal processor.

The control system 12 of the present disclosure includes a software module which is configured to perform a method for testing of the rechargeable battery 4.

Figure 3:
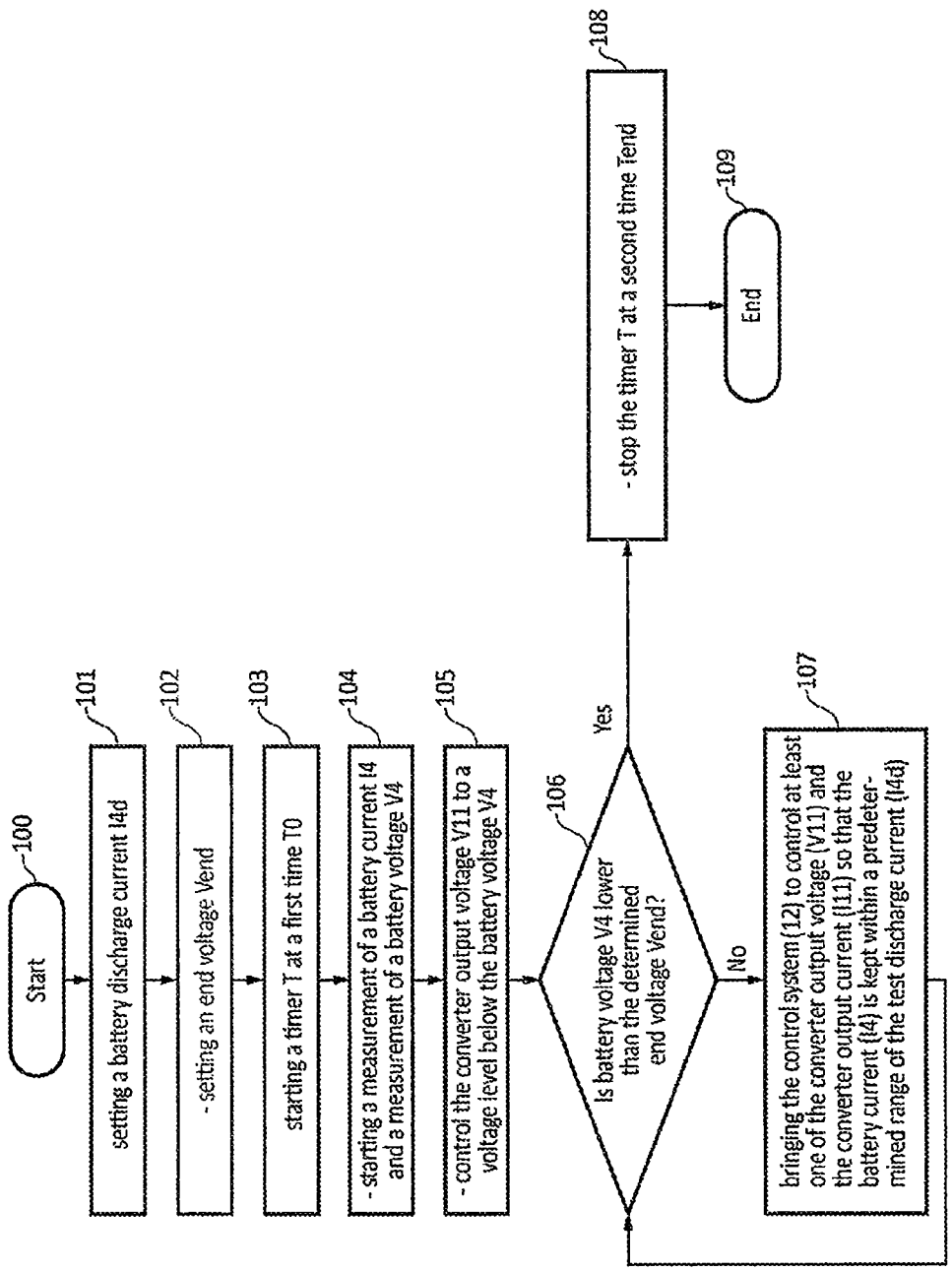
FIG. 3 illustrates a block diagram of the battery testing method.

The battery testing method according to the disclosure is illustrated in the block diagram of FIG. 3. The method described below is used when the power supply system 10 of FIG. 1 is "live", i.e. in a situation where the power supply system 10 of FIG. 1 is supplying power from the power source 2 to the DC load. Preferably, the rechargeable battery is fully charged, or close to fully charged before the battery testing method starts.

EXAMPLE

Figure 4:
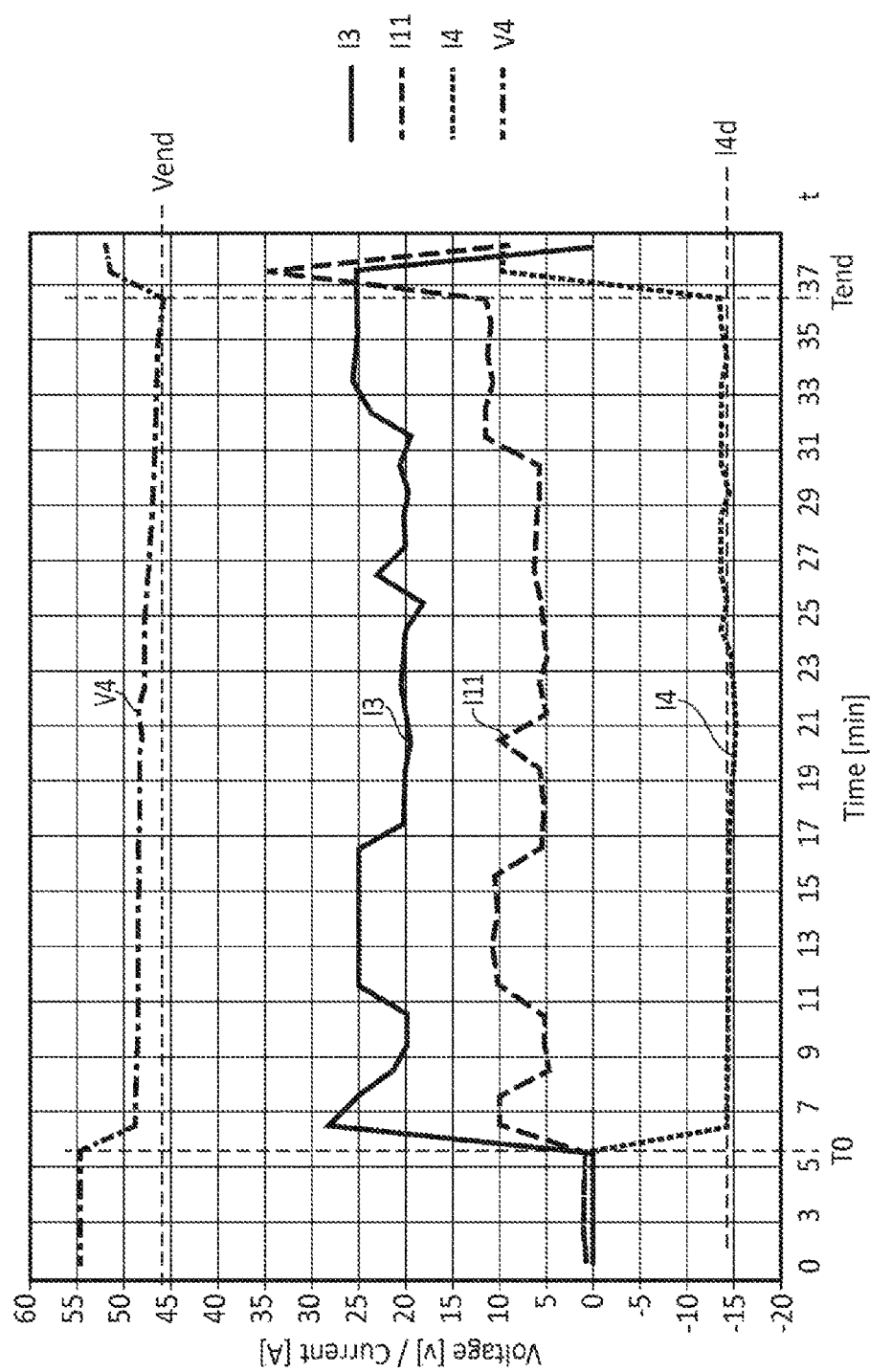
FIG. 4 illustrates voltages and currents resulting from a test of the present disclosure.

In FIG. 4, the results of a test of the battery testing method are provided. In this test, the following equipment was used:
- the power source 2 was the mains (230 V AC)
- the control system 12 was an EltekSmartPackS control system
- the converter 11 was three EltekFlatPackS 48/1800 W Rectifier (AC to DC converter)
- the rechargeable battery 4 was one string of four 12V Marathon M12V60FT batteries
- the load 3 was a programmable, electronic load The load 3 was programmed to vary, as a simulation of a "real" load for such a power supply system 10. It should be noted that the variations in the load is indirectly represented by the load current I3 in FIG. 4, as the converter output voltage V11 (which is equal to the battery voltage V4 and hence also equal to the load voltage V3) is slowly and substantially constantly decreasing as illustrated in FIG. 4.

Initially, in step 100 the test is started. In step 101 and 102, a battery discharge current I4d is set and an end voltage Vend is set.

The battery discharge current I4d may be typically set based on the minimum expected size of the load 3 and in the present example, the battery discharge current I4d was set to −15 A (charging current defined as a positive current, discharging current defined as a negative current) as indicated by a dashed line in FIG. 4.

In this example, the battery was fully charged before the test started, and the end voltage Vend was set to be 1.9V/cell (45.6V), as indicated by the dashed line Vend in FIG. 4.

A test run is now performed.

In step 103, when the test run starts, the timer T of the control system 12 is started to measure the time from a first time T0 as indicated in FIG. 4.

As during normal operation, the control system 12 constantly measures the battery current I4 and battery voltage V4, as described above. This is indicated as step 104 in FIG. 3.

To start the discharge of power from the battery 4 to the load 3, the control system 12 is controlling the converter output voltage V11 of the converter 11 to a voltage level below the battery voltage V4, as indicated in step 105. As seen in FIG. 4, the battery voltage V4 is ca. 55 V before time T0, here the battery current I4 is zero (indicating a full battery 4).

The battery now starts to supply power to the load 3, as indicated by the negative current I4 in FIG. 3. Consequently, the power supplied from the power source to the load 3 via the converter 11 is reduced.

The control system 12 is now calculating a difference ΔI between the battery current I4 and the previously set battery discharge current I4d. It should be noted that the battery current I4 will be dependent on the load current I3, which is varying according to the load variations and the converter output current I11. Hence, the control system 12 is controlling the converter output voltage V11 or the converter output current I11 to keep the current difference ΔI as small as possible.

Consequently, power is supplied to the load 3 from the power source 2 through the converter 11 as needed to hold the battery current I4 substantially constant and substantially close to I4d. Hence, the difference ΔI should be as close to zero as possible.

With other words, the control system 12 is controlling at least one of the converter output voltage V11 and the converter output current I11 so that the battery current I4 is kept within a predetermined range of the test discharge current I4d. This is shown as step 107 in FIG. 3. The purpose is to keep the battery current I4 as close as possible to the test discharge current I4d.

For example, the battery current I4 can be within the range of 0.7 to 1.3 of the test discharge current I4d. Preferably, the battery current I4 is within the range of 0.8 to 1.2 of the test discharge current I4d. Even more preferred, the battery current I4 is within the range of 0.9 to 1.1 of the test discharge current I4d.

As shown in FIG. 4, there are some relatively small variations in the battery current I4, but the battery current I4 is close to the set battery discharge current I4d.

The time measurement by means of the timer T is stopped when the measured battery voltage V4 is equal to the set end voltage Vend. This comparison of the battery voltage V4 and the set end voltage Vend is performed in step 106 in FIG. 3.

This point in time is referred to as the end time Tend, as shown in step 108 in FIG. 3. In FIG. 4, the start time T0 is indicated at t=5.5 minutes and the end time Tend is indicated at t=36.5 minutes. Hence, the time period between the start time T0 and the end time Tend is about 31 minutes. The test run ends at step 109 in FIG. 3.

From the manufacturer of the battery tested in this example, it was stated that the battery should be discharged for 175 minutes before reaching the test end voltage Vend (1.9V/cell). However, in the test, the battery was discharged for only 31 minutes before the test end voltage Vend was reached. This gives a SoH(State Of Health)=31/175*100%=17.7%. Consequently, the battery tested in this example actually illustrates a very poor battery.

According to the disclosure described above, it is achieved a battery testing method where the battery 4 is tested with a constant or substantially constant discharge current according to, or substantially according to the recommendations of thebattery manufacturer while the battery 4 is connected to the DC bus 5 between the power supply system 10 and the load 3, i.e. the battery is "live" during testing.

It should be noted that the battery testing method may include steps for aborting the test under certain circumstances. For example, if there is a failure in the power source 2 and no power can be supplied from the power source to the power supply system 10, then the testing method cannot be continued.

Moreover, the test method may define a "Guard Time Period" after the test, to avoid that a newly tested battery is tested again. In this example, the Guard Time Period must have lapsed before the battery is tested again.

In addition, the test method may include an initial step of canceling the test if there are any alarms indicating failures. Such alarms may be caused by failures due to a broken fuse of a battery, rectifier failures etc.

Figure 2:
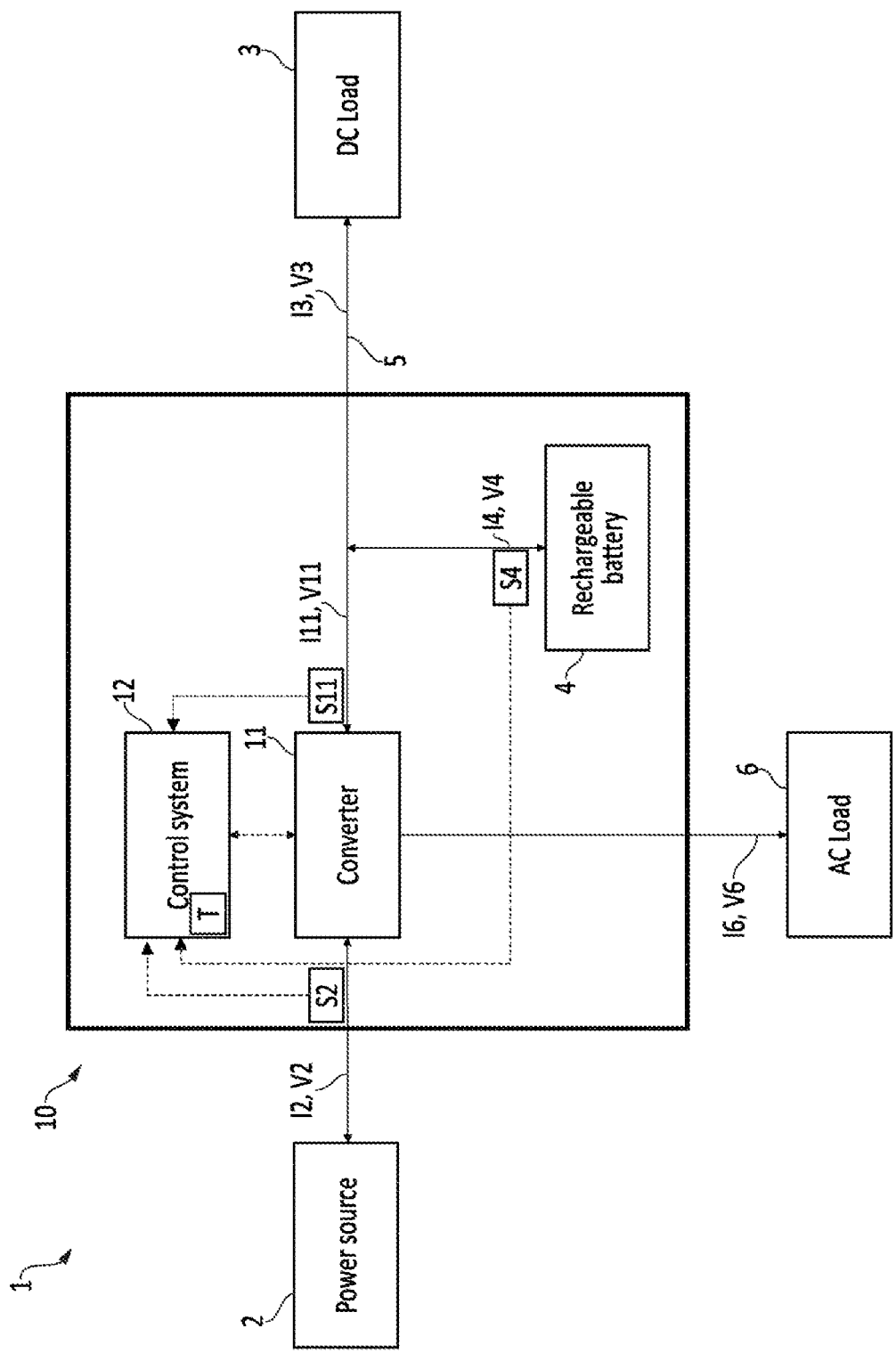
FIG. 2 illustrates an alternative power supply system with a corresponding rechargeable battery connected to the DC bus.

It is now referred to FIG. 2. Here, the converter 11 of the power supply system 10 includes a first AC port connected to the power source 2, a second AC port connected to an AC load 6 and a DC port connected to a DC bus 5, to which the rechargeable battery 4 and the DC load 3 are connected.

It should be noted that here, the DC port is a bidirectional DC port allowing the converter 11 to receive power from the DC bus 5, in addition to supply power to the DC bus as in FIG. 1. Moreover, also the first AC port is bidirectional, allowing power to be transferred from the converter 11 to the power source 2. The mains is one type of power source 2 that will allow power to be supplied to it. The converter 11 of this type is known within the art and will not be described in any further detail here. However, a converter suitable for use in the power supply system 10 of FIG. 2 may for example be of the type presently used in the Rectiverter® marketed by Eltek.

The battery testing method described above may be used for the power supply system 10 in FIG. 2 as well. One difference with the power supply system 10 of FIG. 2 is that the AC load 6 is supplied with power during the battery test as well as the DC load (if any) 3.

The invention claimed is:

1. A method of testing a rechargeable battery (4) connected to a DC bus (5) of a converter (11) of a power supply system (10) comprising a control system (12) for controlling power transfer between a power source (2), the rechargeable battery (4), and a load (3) connected to the DC bus (5), the method comprising the steps of:
  setting a test discharge current (I4d) for the rechargeable battery (4) to be used during the test;
  setting a test end voltage (Vend) for the rechargeable battery (4) to be used during the test;
  at a first point in time (T0), starting a test run measuring a battery current (I4) from the rechargeable battery (4) and a battery voltage (V4) over the rechargeable battery (4);
  at a second point in time (Tend), when the measured battery voltage (V4) becomes equal to the test end voltage (Vend), terminating the test run; and
  registering a time period elapsed between the first point in time (T0) and the second point in time (Tend) as a measure of a status of the rechargeable battery (4);
  characterised in that, during the test run, the method comprises the steps of:
  bringing the converter (11) to deliver an output voltage (V11) which is lower than the battery voltage (V4), thereby causing the rechargeable battery (4) to supply power to the load (3); and
  bringing the control system (12) to control at least one of the output voltage (V11) of the converter (11) and an output current (I11) of the converter (11) so that the battery current (I4) is kept within a predetermined range of the test discharge current (I4d).

2. The method according to claim 1, wherein the battery current (I4) is within a range of 0.7 to 1.3 of the test discharge current (I4d).

3. The method according to claim 2, wherein the battery current (I4) is within a range of 0.8 to 1.2 of the test discharge current (I4d).

4. The method according to claim 3, wherein the battery current (I4) is within a range of 0.9 to 1.1 of the test discharge current (I4d).

5. The method according to claim 1, wherein the method further comprises the step of aborting the testing of the rechargeable battery (4) if a failure situation is detected by the control system (12).

6. A power supply system (10) comprising a converter (11) and a control system (12) for controlling the converter (11), wherein the control system (12) is configured to perform the method according to claim 1.

7. A power supply system (10) comprising:
  a converter (11);
  a control system (12); and
  a rechargeable battery (4) connected to a DC bus (5), wherein the control system (12) is configured to control power transfer between a power source (2), the rechargeable battery (4), and a load (3) connected to the DC bus (5) and perform a method of testing the rechargeable battery (4), and the method comprises the steps of:

setting a test discharge current (I4d) for the rechargeable battery (4) to be used during the test;

setting a test end voltage (Vend) for the rechargeable battery (4) to be used during the test;

at a first point in time (T0), starting a test run measuring a battery current (I4) from the rechargeable battery (4) and a battery voltage (V4) over the rechargeable battery (4);

at a second point in time (Tend), when the measured battery voltage (V4) becomes equal to the test end voltage (Vend), terminating the test run; and registering a time period elapsed between the first point in time (T0) and the second point in time (Tend) as a measure of a status of the rechargeable battery (4);

wherein during the test run, the method comprises the steps of:

bringing the converter (11) to deliver an output voltage (V11) which is lower than the battery voltage (V4), thereby causing the rechargeable battery (4) to supply power to the load (3); and bringing the control system (12) to control at least one of the output voltage (V11) of the converter (11) and an output current (I11) of the converter (11) so that the battery current (I4) is kept within a predetermined range of the test discharge current (I4d).

8. The power supply system according to claim 7, wherein the battery current (I4) is within a range of 0.7 to 1.3 of the test discharge current (I4d).

9. The power supply system according to claim 7, wherein the battery current (I4) is within a range of 0.8 to 1.2 of the test discharge current (I4d).

10. The power supply system according to claim 7, wherein the battery current (I4) is within a range of 0.9 to 1.1 of the test discharge current (I4d).

11. The power supply system according to claim 7, wherein the method further comprises the step of aborting the testing of the rechargeable battery (4) if a failure situation is detected by the control system (12).

12. The power supply system according to claim 7, wherein the power supply system further comprises a first AC port connected to the power source (2), a second AC port connected to an AC load (6), and a DC port connected to the DC bus (5).

13. The power supply system according to claim 12, wherein the DC port is a bidirectional DC port capable of allowing the converter (11) to receive power from the DC bus (5) and supply power to the DC bus (5).

14. The power supply system according to claim 12, wherein the first AC port is a bidirectional AC port capable of allowing power to be transferred from the converter (11) to the power source (2).

15. The power supply system according to claim 7, wherein the control system (12) comprises a digital signal processor configured for receiving signals from at least one sensor disposed in a power system (1) and the power supply system (10) and comprising software for controlling the converter (11) based on the signals from the at least one sensor.

16. The power supply system according to claim 15, wherein the digital signal processor comprises a software module configured to measure time.

17. The power supply system according to claim 7, further comprising a first sensor (S4) configured to sense the battery voltage (V4) and the battery current (I4), and a second sensor (S11) configured to sense the output voltage (V11) of the converter (11) and the output current (I11) of the converter (11).

18. The power supply system according to claim 17, further comprising a third sensor (S2) configured to sense an input voltage (V2) and an input current (I2) supplied from the power source (2) to the converter (11).

19. The power supply system according to claim 7, wherein the control system (12) comprises a timer (T) configured to measure time, wherein the timer (T) is started to measure the time from the first point in time (T0) when the test run starts, and the timer (T) is stopped when the measured battery voltage (V4) is equal to the test end voltage (Vend).

* * * * *